United States Patent [19]
Iwakiri et al.

[11] Patent Number: 5,321,661
[45] Date of Patent: Jun. 14, 1994

[54] SELF-REFRESHING MEMORY WITH ON-CHIP TIMER TEST CIRCUIT

[75] Inventors: Itsuro Iwakiri; Shinichiro Sato, both of Miyazaki, Japan

[73] Assignee: Oki Electric Industry Co., Ltd., Tokyo, Japan

[21] Appl. No.: 974,693

[22] Filed: Nov. 12, 1992

[30] Foreign Application Priority Data

Nov. 20, 1991 [JP] Japan .................................. 3-305120
Nov. 20, 1991 [JP] Japan .................................. 3-305121

[51] Int. Cl.$^5$ .............................................. G11C 13/00
[52] U.S. Cl. ........................................ 365/222; 365/201
[58] Field of Search ................... 371/21.1, 21.2, 21.3, 371/22.5, 37.3; 365/222, 201

[56] References Cited

U.S. PATENT DOCUMENTS

| | | | |
|---|---|---|---|
| 4,672,583 | 6/1987 | Nakaizumi | 371/21.2 |
| 4,682,306 | 7/1987 | Sakurai et al. | 365/222 |
| 4,827,476 | 5/1989 | Garcia | 371/21.1 |
| 5,119,338 | 6/1992 | Saito | 365/222 |
| 5,157,634 | 10/1992 | Dhong et al. | 365/222 |

Primary Examiner—Eugene R. LaRoche
Assistant Examiner—Vu A. Le
Attorney, Agent, or Firm—Spencer, Frank & Schneider

[57] ABSTRACT

A self-refreshing memory has a refresh timer that generates refresh requests at a certain rate, and a refresh address counter that generates refresh addresses by counting the refresh requests. A refresh test circuit receives test signals from automatic test equipment that cause it to disable the refresh timer, reset the refresh address counter, then enable the refresh timer for a certain interval. At the end of this interval the refresh test circuit disables the refresh timer again and generates an output signal such as a serial data signal indicating the current refresh address, or a pass-fail signal indicating whether the refresh address is equal to or greater than a preset pass value.

25 Claims, 15 Drawing Sheets

SELF-REFRESHING MEMORY WITH ON-CHIP TIMER TEST CIRCUIT

BACKGROUND OF THE INVENTION

This invention relates to a self-refreshing semiconductor memory with circuits for testing the refresh timer.

Generally referred to as a pseudo-static random-access memory or a virtual-static random-access memory, a self-refreshing memory has dynamic memory cells that require periodic refreshing, and also has circuits that refresh the memory cells at intervals controlled by a built-in timer. The growing demand for a self-refreshing memory, which combines the ease of use of a static random-access memory (SRAM) with the low cost of a dynamic random-access memory (DRAM), has made it necessary to produce and test self-refreshing memory devices in large quantities. One of the tests that must be performed is a test of the built-in timer, to verify that it generates refresh request signals at a rate fast enough to refresh all memory cells before loss of data occurs. If the built-in timer is suitably programmable, the results of this test can also be used to adjust the timer to the optimum rate, so that current is not wasted by refreshing more often than necessary.

One prior-art method of performing this test is to output the refresh request signals at a test pin and measure their frequency. A disadvantage of this method is that automatic memory test equipment is not normally designed for frequency measurements, so the test must be carried out with a separate instrument such as a frequency counter. The inability to use automatic test equipment makes this test method impractical for volume production.

Another prior-art method is to write a certain data pattern in the memory device, then pause for an interval longer than the data retention time of the memory cells, then read the data from all memory cells. If the built-in timer is producing refresh requests at the necessary rate, the same data should be read as was written into the memory cells. The test is normally performed twice, using different data patterns. Although this test can be carried out by automatic test equipment, it has the disadvantage that if the memory capacity is large, it takes considerable time to read and write all memory cells. In the case of a sixteen-megabit memory, for example, a two-pattern test takes fifteen seconds.

SUMMARY OF THE INVENTION

It is accordingly an object of the present invention to test the built-in refresh timer of a self-refreshing memory quickly, using automatic test equipment.

Another object of the invention is to quickly provide information for adjusting the built-in refresh timer.

The invented self-refreshing memory comprises memory cells for storing data, a refresh timer, a refresh controller, a refresh address counter, and a refresh test circuit. The refresh timer generates refresh request signals at fixed intervals. The refresh controller receives the refresh request signals, refreshes memory cells in locations corresponding to a refresh address, and generates an increment signal. The refresh address counter counts occurrences of the increment signal, thereby generating successive refresh addresses.

The refresh test circuit receives test signals from automatic test equipment that cause it to disable the refresh timer and reset the refresh address counter, then enable the refresh timer for a certain interval, then disable the refresh timer again and generate an output signal responsive to the refresh address in the refresh counter.

According to one aspect of the invention the output signal is a serial data signal comprising the refresh address. According to another aspect of the invention, the output signal is a pass-fail signal indicating whether the refresh address is at least equal to a certain pass value.

DETAILED DESCRIPTION OF THE INVENTION

Embodiments of the invention and its constituent circuits will now be described with reference to the attached drawings. The drawings are provided to illustrate the invention but they do not restrict the scope of the invention, which should be determined solely from the appended claims.

Figure 1:
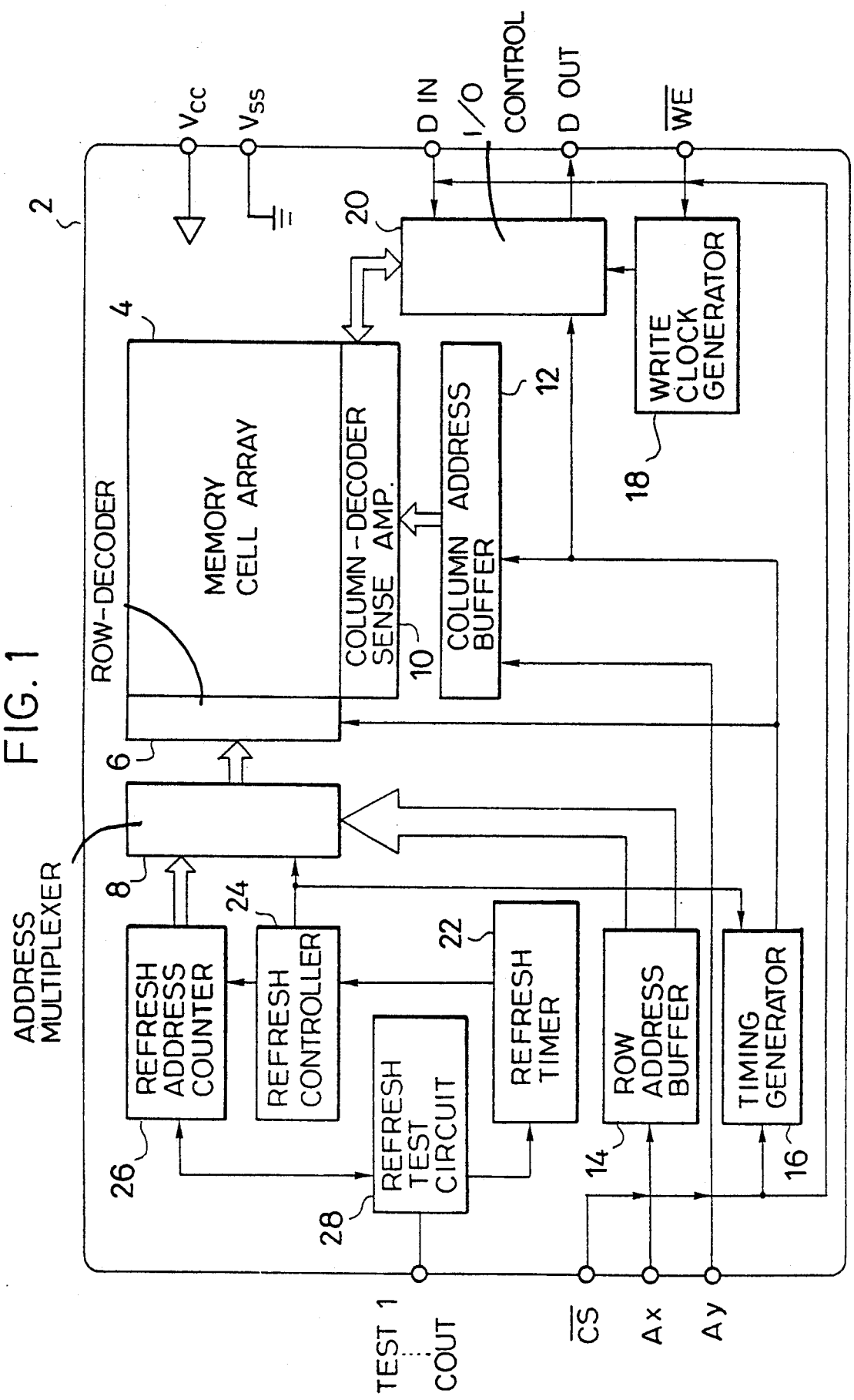
FIG. 1 is a general block diagram of the invented selfrefreshing memory.

Referring to FIG. 1, the invented self-refreshing memory 2 comprises a memory cell array 4 having dynamic memory cells, a row decoder 6, an address multiplexer 8, a column-decoder and sense-amplifier circuit 10, a column address buffer 12, a row address buffer 14, a timing generator 16, a write clock generator 18, and an I/O control circuit 20. When the memory is selected by a chip select signal ($\overline{CS}$), the I/O control circuit 20 inputs or outputs data, depending on the state of a write enable signal ($\overline{WE}$), to or from an address in the memory cell array 4 selected by row and column address input signals (Ax and Ay). Detailed descriptions of the above circuits will be omitted because they are well known to those skilled in the art.

The self-refreshing memory 2 also comprises a refresh timer 22, a refresh controller 24, a refresh address counter 26, and a novel refresh test circuit 28. These circuits will be described in detail below.

Figure 2:
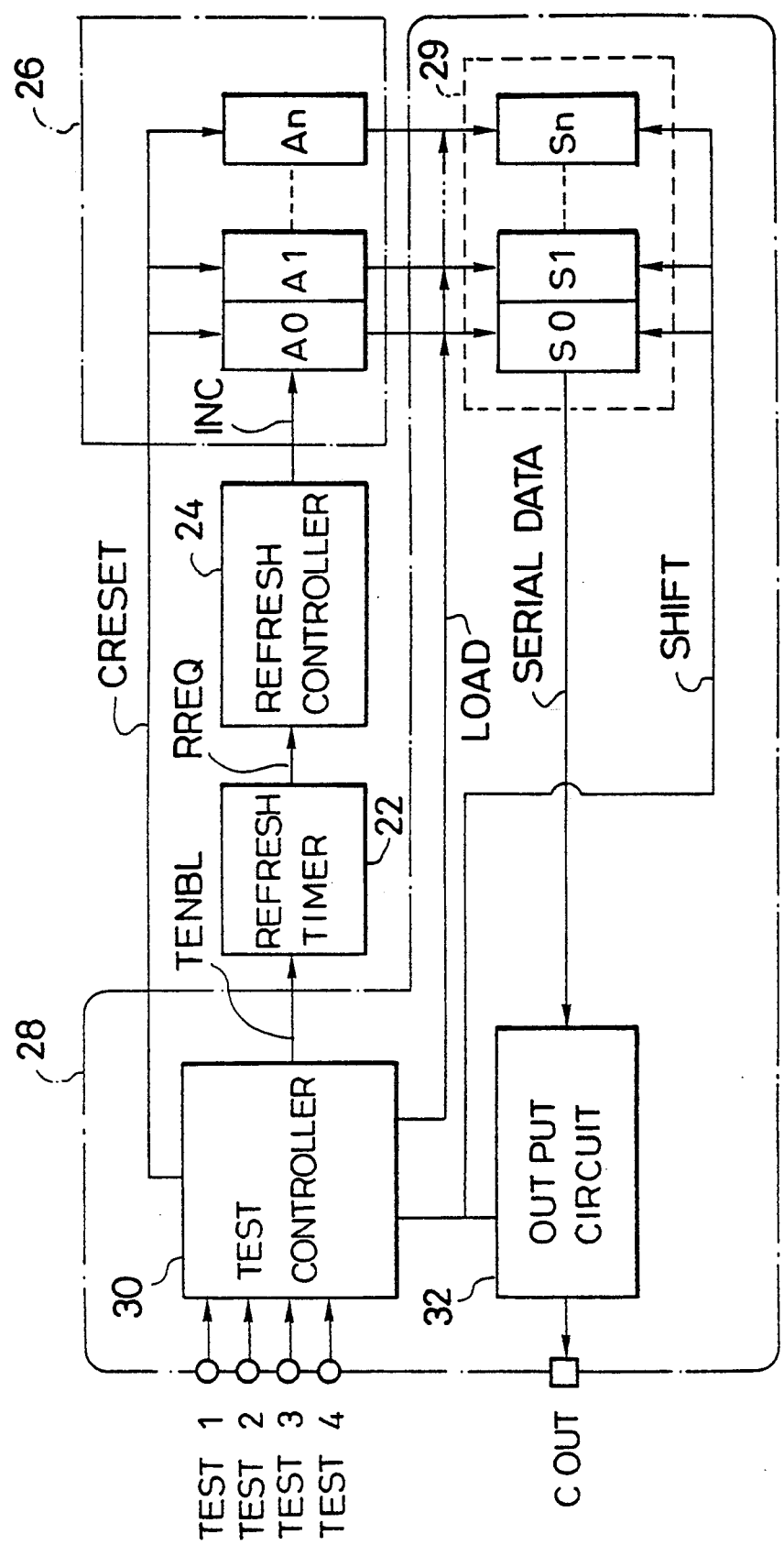
FIG. 2 is a block diagram of the test circuit and related circuits according to one aspect of the invention.

Referring to FIG. 2, the refresh timer 22 receives an enable signal (TENBL) from the refresh test circuit 28. While TENBL is active, the refresh timer 22 generates refresh request signals (RREQ) at regular intervals and sends these signals to the refresh controller 24. The interval at which refresh request signals are generated is referred to as the refresh cycle. Each refresh request signal causes the refresh controller 24 to initiate a refresh operation. After the refresh operation is completed, the refresh timer 22 sends an increment signal (INC) to the refresh address counter 26.

The refresh address counter 26 generates a refresh address (A0, A1, ..., An) by counting occurrences of the increment signal INC. The refresh address (A0, A1, ..., An) can be output to the address multiplexer 8 in FIG. 1, and can also be loaded into a shift register 29 in the refresh test circuit 28.

The refresh test circuit 28 comprises the shift register 29, a test controller 30 and an output circuit 32. The test controller 30 is coupled to four input terminals TEST1, TEST2, TEST3, and TEST4 at which external signals are received from automatic test equipment. From the TEST1 input signal, the test controller 30 generates a reset signal (CRESET) that resets the refresh address (A0, A1, ..., An) in the refresh address counter 26 to zero. From the TEST1 and TEST2 input signals, the test controller 30 generates the enable signal (TENBL) supplied to the refresh controller 24. From the TEST3 signal, the refresh test circuit 28 generates a load signal that loads the refresh address from the refresh address counter 26 into the shift register 29. From the TEST4 signal, the refresh test circuit 28 generates a shift signal that shifts the contents of the shift counter 29.

The output circuit 32 is an inverting tri-state buffer that is in the high-impedance state when the TEST4 signal is high. When TEST4 is low, the output circuit 32 receives one bit of serial data from the shift register 29, inverts the bit, and outputs the inverted bit to an external terminal denoted COUT. Tri-state buffers are well known, so a circuit diagram will be omitted.

Figure 3:
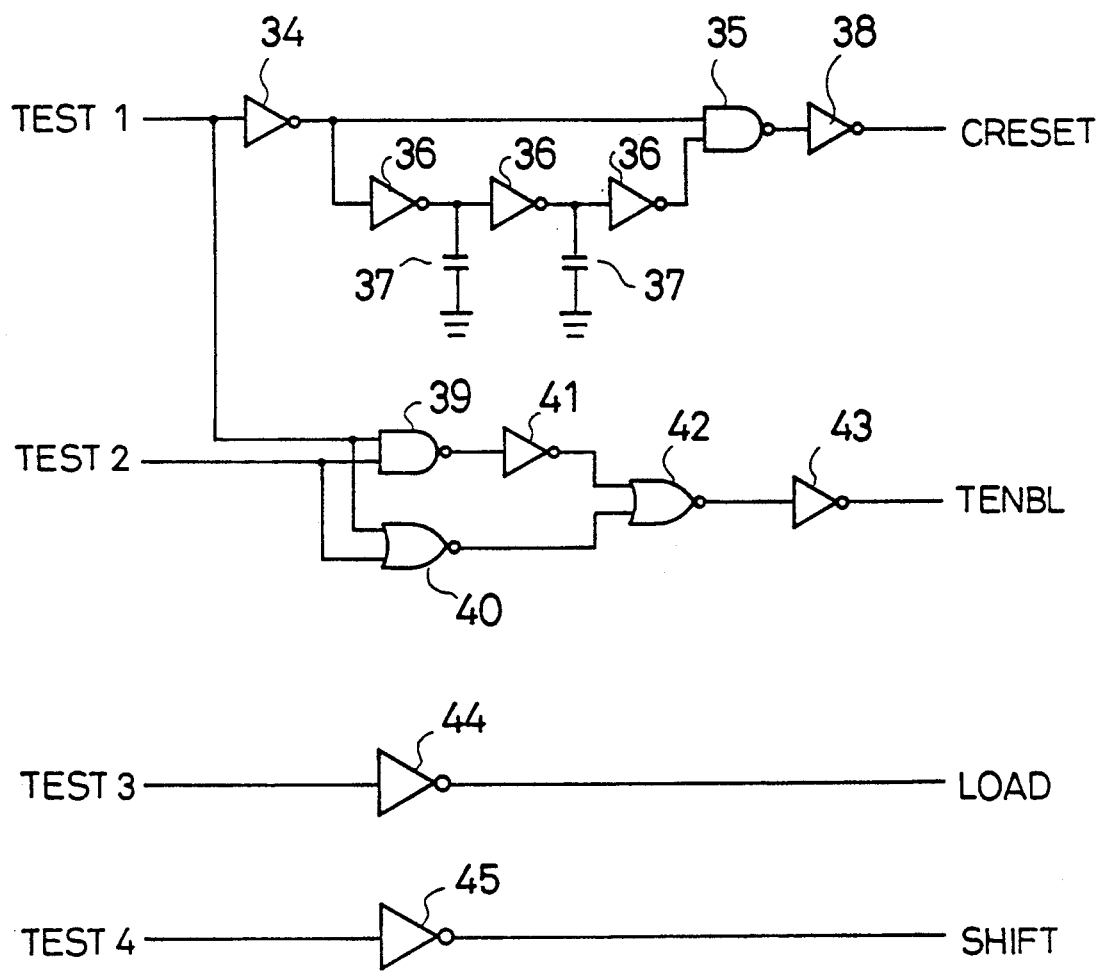
FIG. 3 is a schematic diagram of the test control circuit in FIG. 2 with a NAND gate to produce CRESET.

FIG. 3 shows a preferred circuit configuration of the test controller 30. The TEST1 signal is input to an inverter 34, the output of which feeds one input of a NAND gate 35. The output of the inverter 34 is also branched through an inverting delay line to the second input of the NAND gate 35. The inverting delay line comprises an odd number of inverters 36 (in this case three) connected in series, with the connecting lines between them coupled through capacitors 37 to ground. The output of the NAND gate 35 is inverted by an inverter 36 to become the CRESET signal.

With this configuration the two inputs to the NAND gate 35 normally have complementary values and the CRESET signal is normally low, regardless of the state of the TEST1 signal. When TEST1 changes from high to low, however, there is a brief interval in which both inputs to the NAND gate 35 are high, during which interval the NAND gate 35 and inverter 38 generate a high CRESET pulse.

The TEST1 and TEST2 signals are also input to a NAND gate 39 and a NOR gate 40. The output of the NAND gate 39 is inverted by an inverter 41 and input, together with the output of the NOR gate 40, to a second NOR gate 42. The output of the NOR gate 42 is inverted by an inverter 43 to become the enable signal TENBL. The NAND gate 39, NOR gates 40 and 42, and inverters 41 and 43 form an exclusive-NOR gate, so TENBL is high when TEST1 and TEST2 have the same value and low when TEST1 and TEST2 have different values.

The test controller 30 also comprises an inverter 44 that inverts the TEST3 signal to produce the load signal, and an inverter 45 that inverts the TEST4 signal to produce the shift signal.

Figure 4:
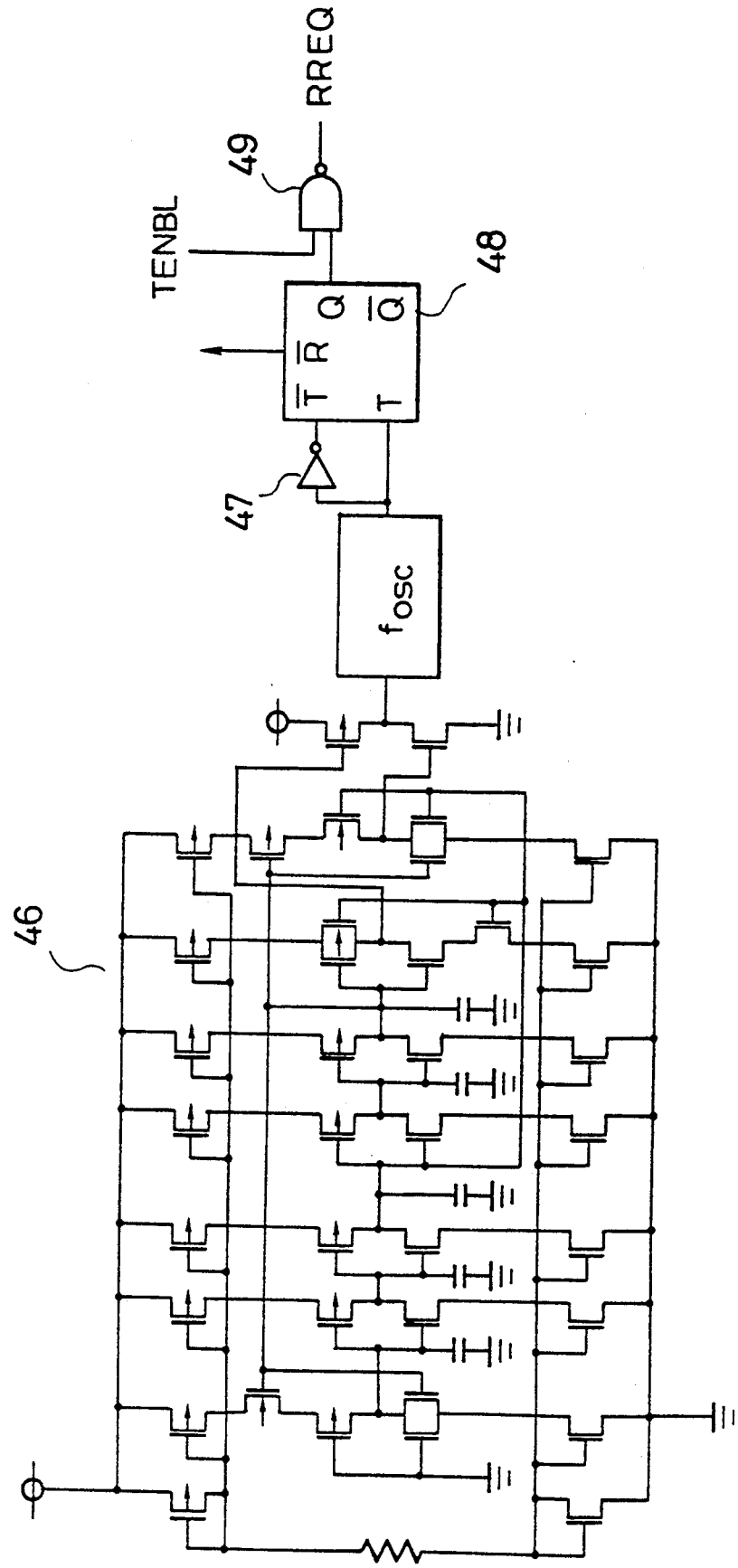
FIG. 4 is a schematic diagram of the refresh timer in FIG. 2.

FIG. 4 shows a preferred circuit configuration of the refresh timer 22 comprising an oscillating circuit 46, an inverter 47, a toggle flip-flop 48, and a NAND gate 49. The oscillating circuit 46 produces an output signal that oscillates at a frequency $f_{OSC}$, as indicated in the drawing. This output signal and its inverse, which is generated by the inverter 47, are fed to the T and $\overline{T}$ inputs of the toggle flip-flop 48. The toggle flip-flop 48 is adapted to reverse the state of its outputs Q and $\overline{Q}$ at each low-to-high transition of the T input and high-to-low transition of the $\overline{T}$ input. The Q output of the toggle flip-flop 47 accordingly oscillates with a frequency equal to one-half $f_{OSC}$.

The Q output becomes one input of the NAND gate 49, the other input being the TENBL signal from the test controller 30. The output of the NAND gate 49 is the refresh request signal RREQ. While TENBL is low, RREQ remains high. While TENBL is high, RREQ alternates between the high and low states at the same rate as the Q output of the toggle flip-flop 48.

Figure 5:
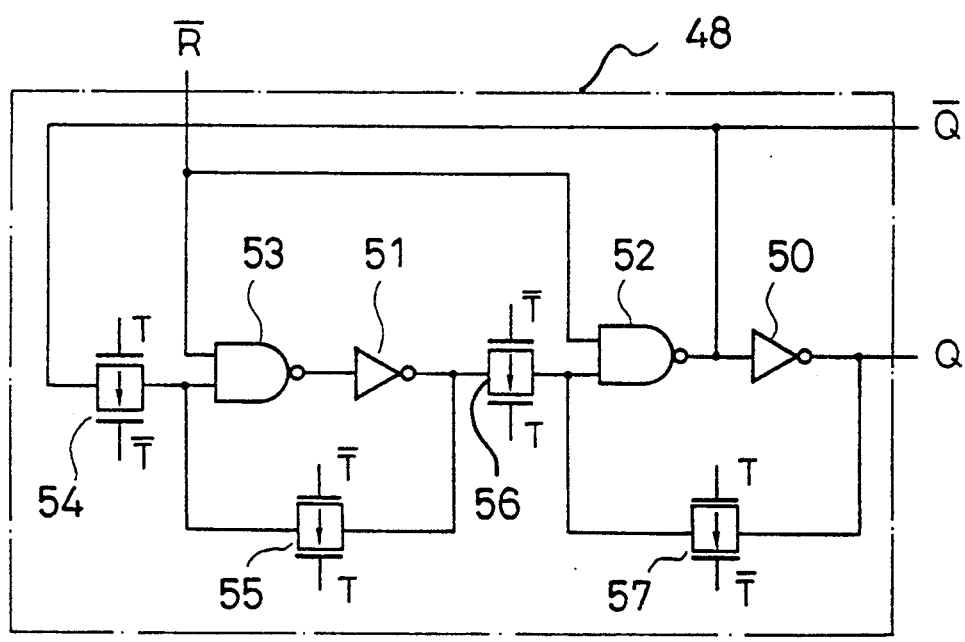
FIG. 5 is a schematic diagram of the toggle flip-flop in FIG. 4.

FIG. 5 shows a preferred circuit configuration of the toggle flip-flop 48. This circuit comprises a pair of inverters 50 and 51, a pair of NAND gates 52 and 53, and four transmission gates 54, 55, 56, and 57. When the reset input $\overline{R}$ is low, the output of the NAND gate 52 is always high, so the Q output is low and the $\overline{Q}$ output is high. When $\overline{R}$ is high, if the T input is low and the $\overline{T}$ input high, then the transmission gates 54 and 57 are switched on while the transmission gates 55 and 56 are off. Feedback through the transmission gates 57 and 54 holds the NAND gate 52 and inverter 50 in their current state, and the NAND gate 53 and inverter 51 in the opposite state. If the T input changes from low to high and the $\overline{T}$ input from high to low, the transmission gates 54 and 57 turn off while the transmission gates 55 and 56 turn on. The transmission gates 55 and 56 now hold the NAND gate 53 and inverter 51 in their current state, and feed this state forward to the NAND gate 52 and inverter 50, causing the Q and $\overline{Q}$ outputs to toggle.

Figure 6:
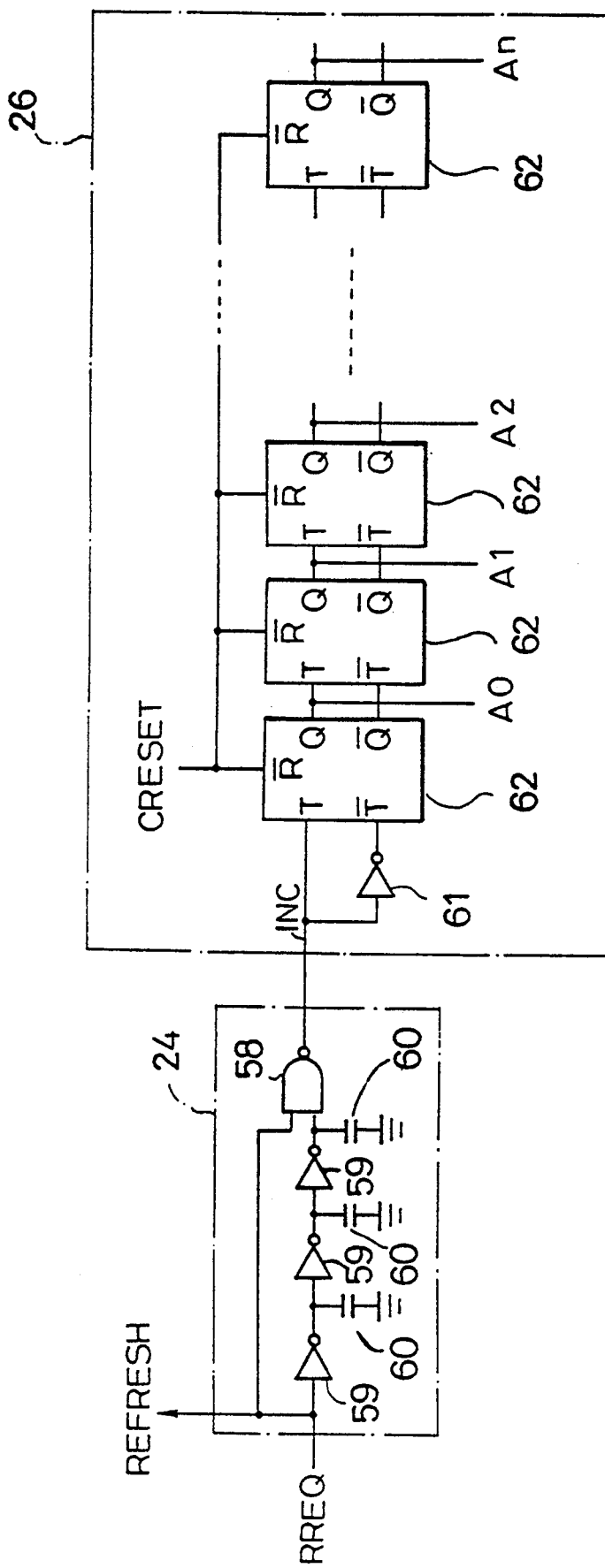
FIG. 6 is schematic diagram of the refresh controller and refresh address counter in FIG. 2.

FIG. 6 shows a preferred circuit configuration of the refresh controller 24 and refresh address counter 26. The refresh controller 24 receives the refresh request signal RREQ from the refresh timer 22 and outputs it as a refresh signal to the address multiplexer 8. High-to-low transitions of the refresh signal cause the address multiplexer 8 to latch the current refresh address output of the refresh address counter 26 and initiate an internal read operation that refreshes memory cells having this refresh address as their row address.

The RREQ input is also fed to one input of a NAND gate 58, and through an odd number (three) of inverters 59 to the other input of the NAND gate 58. The outputs of the three inverters 59 are coupled through capacitors 60 to ground, so that they act as an inverting delay line. The output of the NAND gate 58 is therefore normally high, but goes low briefly at each low-to-high transition of the RREQ signal. The output of the NAND gate 58 is fed to the refresh address counter 26 as the increment signal INC.

The refresh address counter 26 comprises an inverter 61 and a plurality of toggle flip-flops 62 of the type shown in FIG. 5, for example, coupled in series. The counter reset signal (CRESET) is coupled to the reset inputs ($\overline{R}$) of all the toggle flip-flops 62. The Q outputs of the toggle flip-flops 62 form the refresh address (A0, A1, ..., An). The increment signal (INC) and its inverse are fed to the T and $\overline{T}$ inputs of the first toggle flip-flop 62. The Q and $\overline{Q}$ outputs of each toggle flip-flop 62 are coupled to the T and $\overline{T}$ inputs of the next toggle flip-flop 62, so that the refresh address counter 26 acts as a binary counter, incrementing the refresh address value (A0, A1, ..., An) by one at each low-to-high transition of INC.

Figure 7:
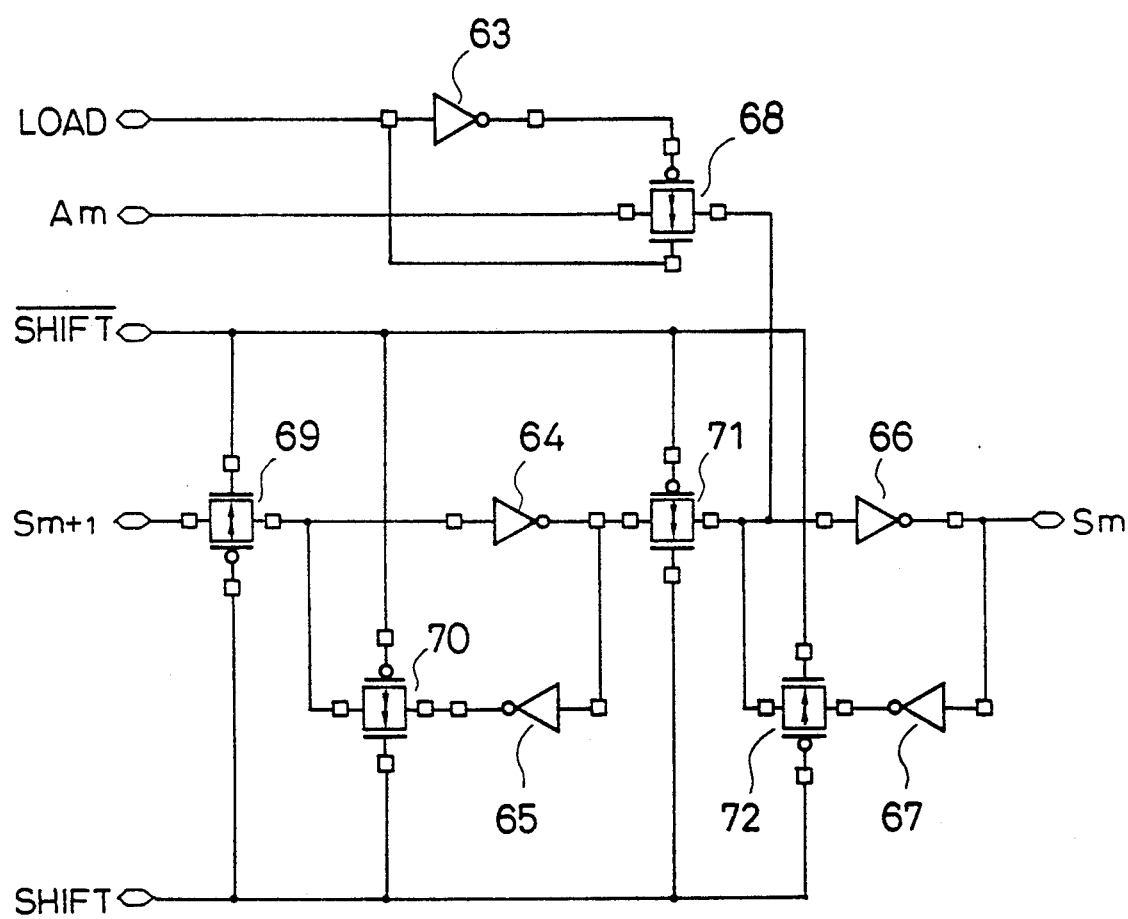
FIG. 7 is a schematic diagram of one stage of the shift register in FIG. 2.

FIG. 7 shows a preferred circuit configuration of the m-th stage of the shift register 29, comprising inverters 63, 64, 65, 66, and 67 and transmission gates 68, 69, 70, 71, and 72. The input signals are the load and shift signals from the test controller 30, the m-th refresh address bit Am from the refresh address counter 26, and the (m+1)-th bit of serial data Sm+1 from the preceding stage of the shift register 29. The shift signal is input in both normal form (SHIFT) and inverted form ($\overline{SHIFT}$). The output signal is the m-th bit of serial data Sm.

When the SHIFT signal is inactive and $\overline{SHIFT}$ is active, the transmission gates 69 and 72 are on, the transmission gates 70 and 71 are off, the inverters 66 and 67 hold the current state of the output Sm, and the input Sm+1 is fed to the inverter 64. When the SHIFT signal is active and $\overline{SHIFT}$ is inactive, the transmission gates 69 and 72 turn off, the transmission gates 70 and 71 turn on, the inverters 64 and 65 hold the old value of the Sm+1 input, and this value is fed forward through the transmission gate 71 to become the new output Sm. When the LOAD signal is active, SHIFT and $\overline{SHIFT}$ are both made inactive, the transmission gate 68 turns on, and the address signal Am is fed to the inverter 66, so that the output signal Sm becomes the complement of Am; then $\overline{SHIFT}$ becomes active and the transmission gates 69 and 72 turn on, holding the output state of Sm, after which the LOAD signal can be deactivated.

Figure 15:
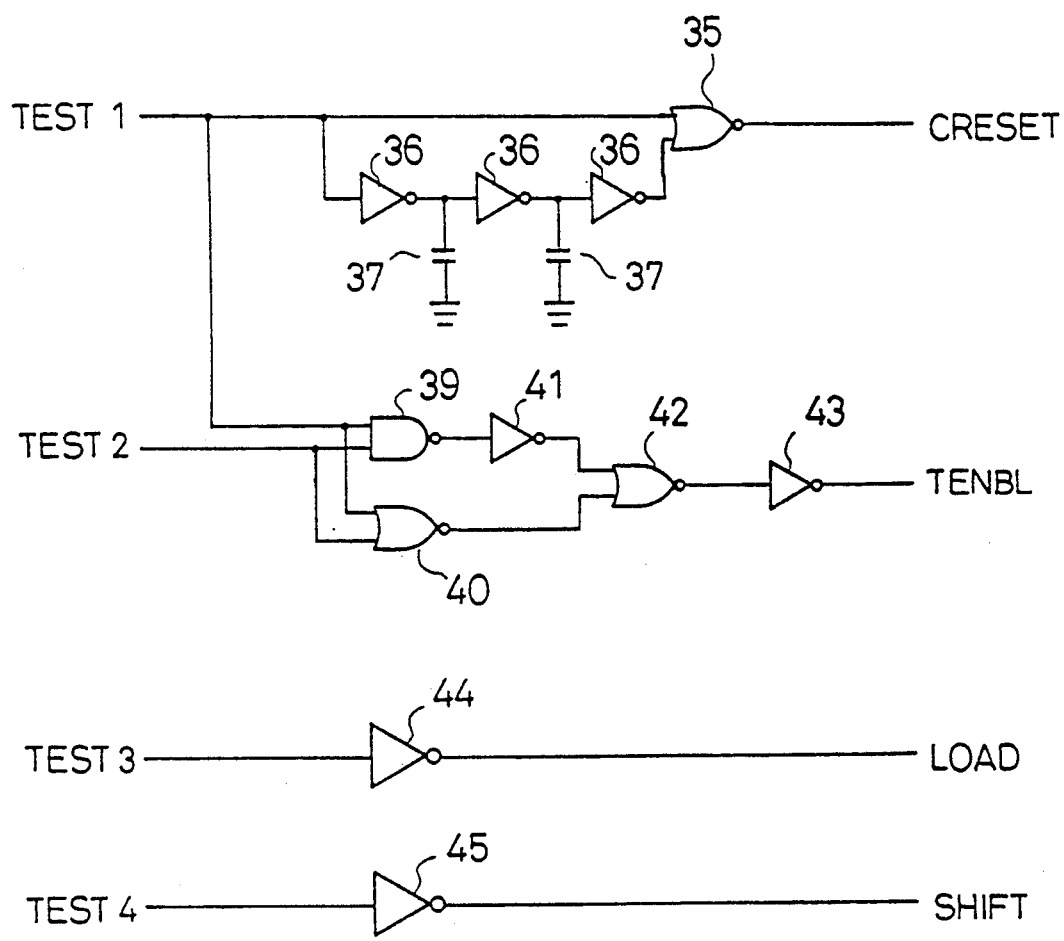
FIG. 15 is a schematic diagram of the test control circuit in FIG. 2 with a NOR gate to produce CRESET.

The invention is not restricted to the circuits shown in FIGS. 3 to 7. Various obvious modifications can be made, such as replacing the NAND gate 35 in FIG. 3 with a NOR gate and eliminating the inverters 34 and 38 as shown in FIG. 15, or the invention can be practiced with completely different circuits that provide equivalent functions.

Figure 8:
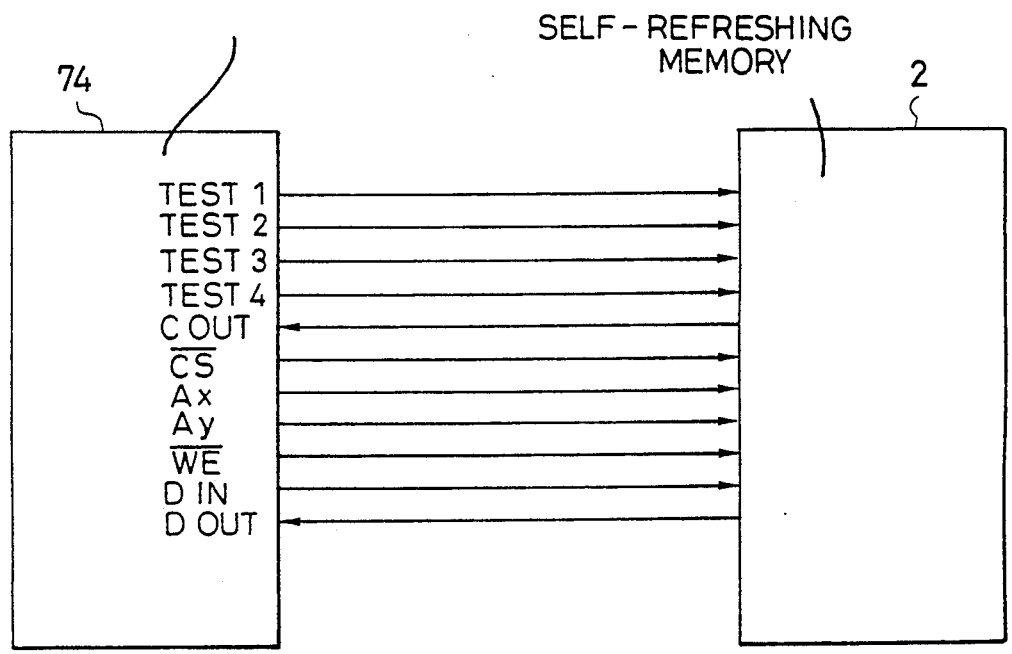
FIG. 8 is a diagram showing interconnections between automatic test equipment and the memory illustrated in FIGS. 1 and 2.

The memory manufacturer tests the self-refreshing memory 2 by connecting it to automatic test equipment 74 as shown in FIG. 8. The signals TEST1, TEST2, TEST3, TEST4, and COUT are used for testing the cycle time of the refresh timer 22. The other signals $\overline{CS}$, Ax, Ay, $\overline{WE}$, DIN, and DOUT are used for testing read and write functions and the integrity of memory cells. For a refresh cycle test, the automatic test equipment 74 is programmed to output the test signals TEST1, TEST2, TEST3, TEST4 as follows.

Figure 9:
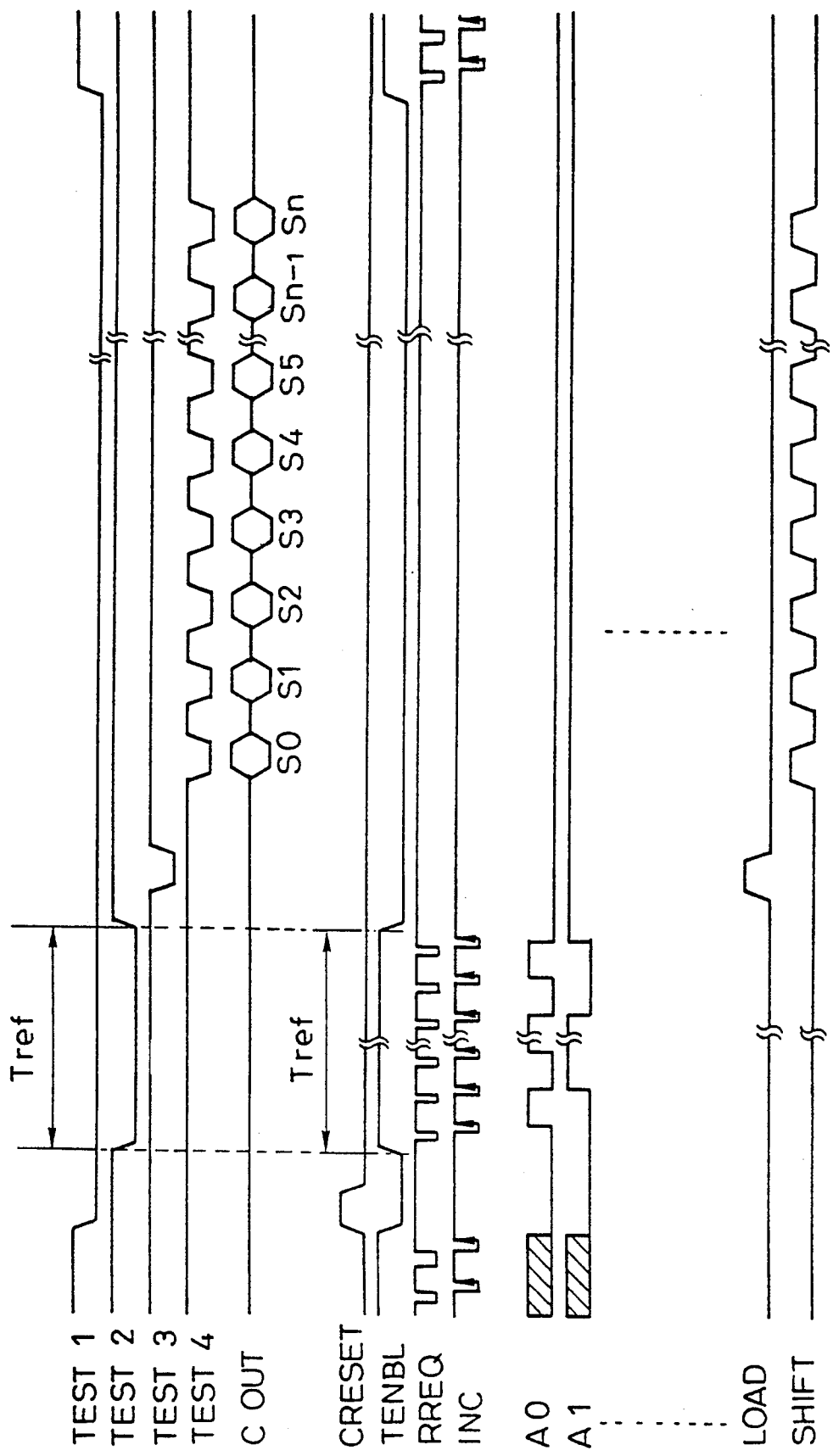
FIG. 9 is a timing diagram of a refresh cycle test.

Referring to FIG. 9, in the initial state TEST1, TEST2, TEST3, TEST4 are all high, CRESET is low, TENBL, RREQ, and INC are high, and the LOAD and SHIFT signals are low. The automatic test equipment 74 begins the refresh cycle test by driving TEST1 low. The high-to-low transition of TEST1 causes a brief high CRESET pulse that resets the refresh address to zero (A0, A1, ..., An all low). Since TEST1 and TEST2 now have different values, TENBL goes low, disabling output of refresh request signals.

Next the automatic test equipment 74 drives TEST2 low for a precise interval of time Tref. During this interval TEST1 and TEST2 have the same value, so TENBL is high, the refresh timer outputs refresh request pulses RREQ, and the refresh controller 24 outputs increment pulses INC which are counted by the refresh address counter 26. The refresh address signals A0, A1, ... accordingly change as shown.

At the end of the interval Tref the automatic test equipment 74 drives TEST2 high again, so TENBL goes low, disabling the output of refresh request and increment pulses RREQ and INC, and the refresh address counter 26 stops counting.

Next the automatic test equipment 74 briefly drives TEST3 low, generating a high load pulse, causing the one's complement of the count value in the refresh address counter 26 to be loaded into the shift register 29.

To read the count value, the automatic test equipment 74 now drives TEST4 low n+1 times in times in succession, generating a series of shift pulses. The shift register 29 responds by sending its contents one bit at a time to the output circuit 32, which inverts the bits and outputs them at the COUT terminal as serial data S0, S1, ..., Sn. By reading the serial data the automatic test equipment 74 can determine how many refresh requests RREQ were generated in the interval Tref. If the number of refresh requests is N, it is then a simple matter to divide Tref by N to determine the refresh cycle time and decide whether this cycle time is within acceptable bounds. The entire refresh test takes only a short time: only one or two seconds, for example, for a sixteen-megabit memory.

If the refresh timer is provided with additional circuits that make the refresh cycle programmable, then data from the above refresh test can be used to adjust the refresh timer to the optimum refresh rate. Moreover, the novel refresh test circuit 28 can be used to determine the optimum refresh rate by disabling the refresh timer so that a data retention test can be carried out. In this way the manufacturer can produce self-refreshing memories with maximum reliability and minimum current dissipation.

During normal operation TEST1, TEST2, TEST3, and TEST4 are all pulled up to the high state, holding TENBL high, allowing the refresh timer 22 to operate, and keeping the COUT output terminal in the high-impedance state.

If it is only desired to obtain a pass or fail result from the refresh test and is not necessary to know the exact number of refresh requests generated in the interval Tref, the test procedure can be simplified by modifying the refresh test circuit as described below.

Figure 10:
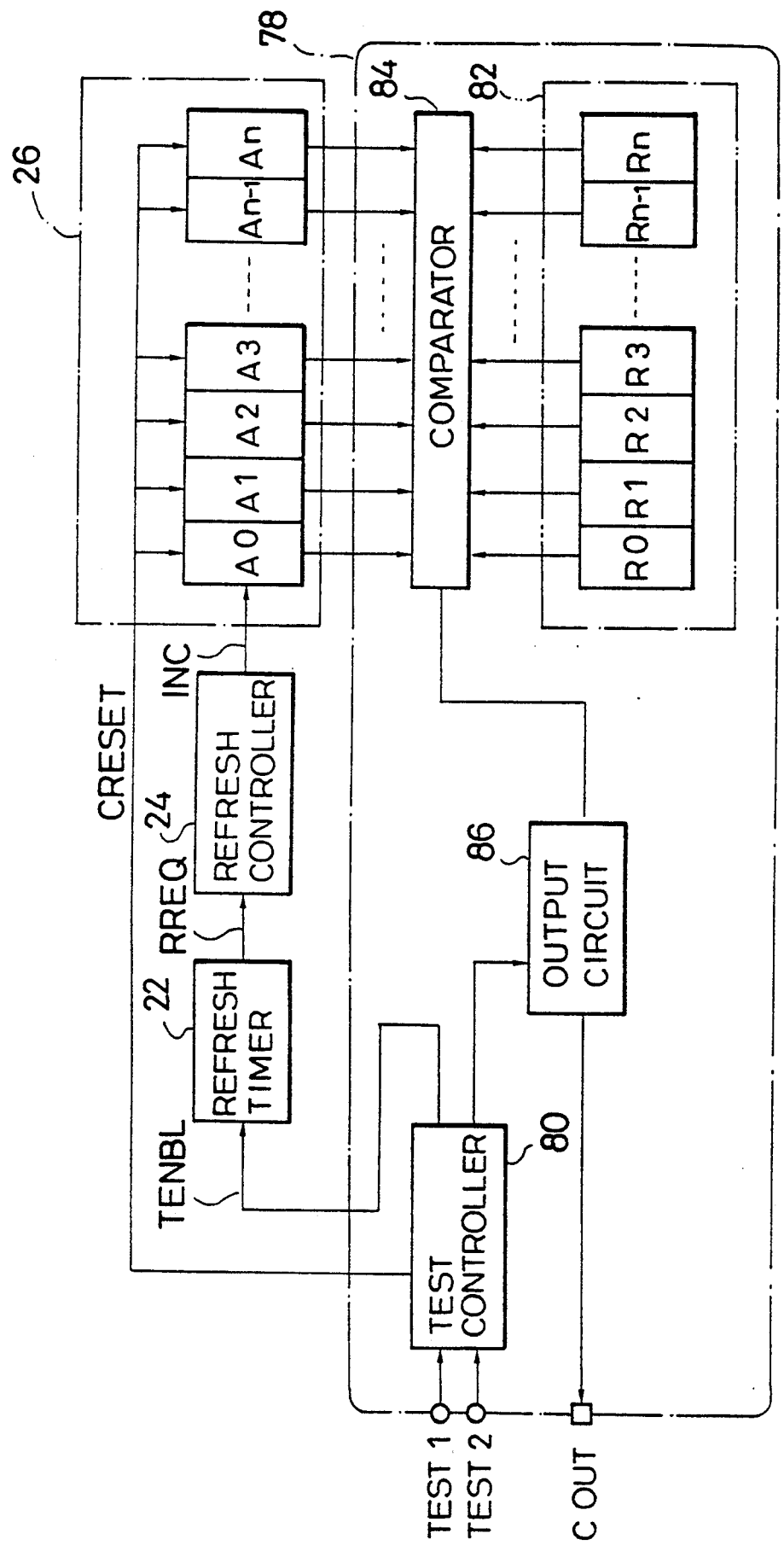
FIG. 10 is a block diagram of the test circuit and related circuits according to another aspect of the invention.

These modifications are illustrated in FIG. 10. The refresh timer 22, refresh controller 24, and refresh address counter 26 are as already described. The refresh test circuit 78 now comprises a test controller 80, a register 82, a comparator 84, and an output circuit 86.

The test controller 80 receives TEST1 and TEST2 signals from the automatic test equipment and processes them as described above to generate a counter reset signal CRESET and timer enable signal TENBL. The circuit configuration of the test controller 80 may be identical to that shown in FIG. 3, without the inverters 44 and 45.

The register 82 stores an (n+1)-bit pass value B which is the pass-fail criterion of the refresh cycle test.

If Ncyc is the number of refresh operations needed to refresh all memory cells in the memory cell array 4 and Tdh is the data retention time of the memory cells, then the pass value B set in the register 82 should satisfy the following inequality:

$$B > Ncyc \times Tref/Tdh$$

Figure 11:
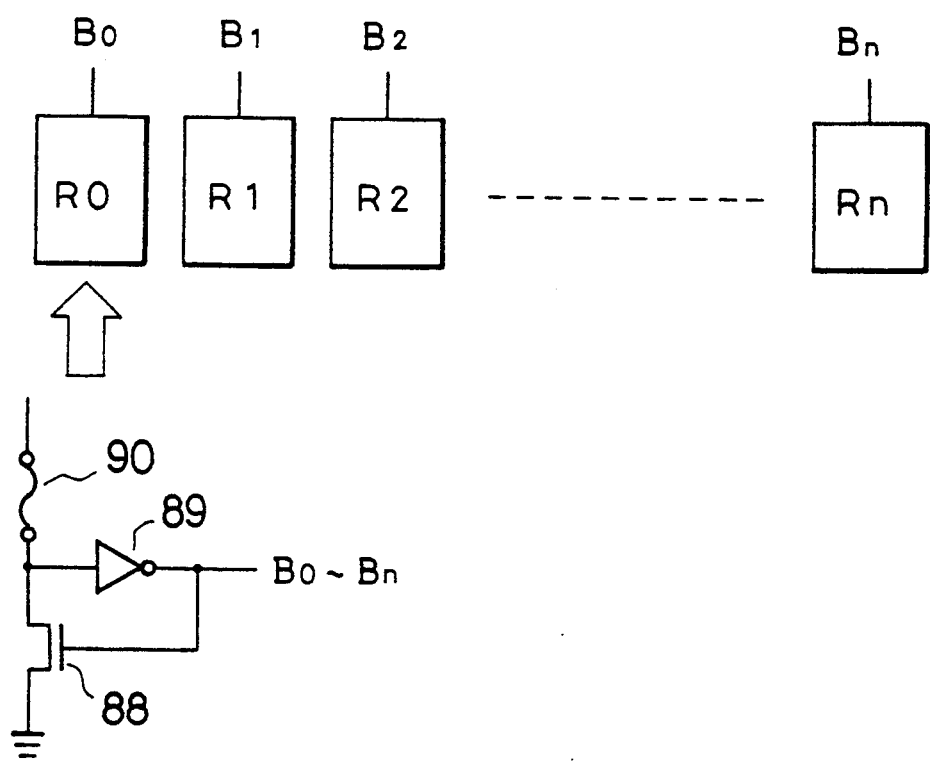
FIG. 11 is a schematic diagram of the register in FIG. 10.

The register 82 is, for example, a fuse-programmable register with identical circuits R0, R1, R2, ..., Rn of the type shown in FIG. 11, each comprising a transistor 88, an inverter 89, and a fuse 90. The source electrode of the transistor 88 is connected to ground. The fuse 90 connects the drain electrode of the transistor 88 to the power supply. The drain electrode is also branched to the input of the inverter 89, the output of which drives the gate electrode of the transistor 88. If the fuse 90 is intact, the input to the inverter 89 is high, its output is low, and the transistor 88 is turned off. If the fuse 90 is blown, the circuit stabilizes in the opposite state, with the input to the inverter 89 low, its output high, and the transistor 88 turned on. The output of the inverter 89 is the value of one bit in the register 82; these bit values are denoted B0, B1, ..., Bn.

An advantage of the circuit in FIG. 11 is that the fuses 90 can be blown even after the fabrication process is completed, so the pass value can be changed according to the results of other tests. The invention is not limited, however, to the circuit in FIG. 11; it can be practiced with various other types of register circuits.

Figure 12:
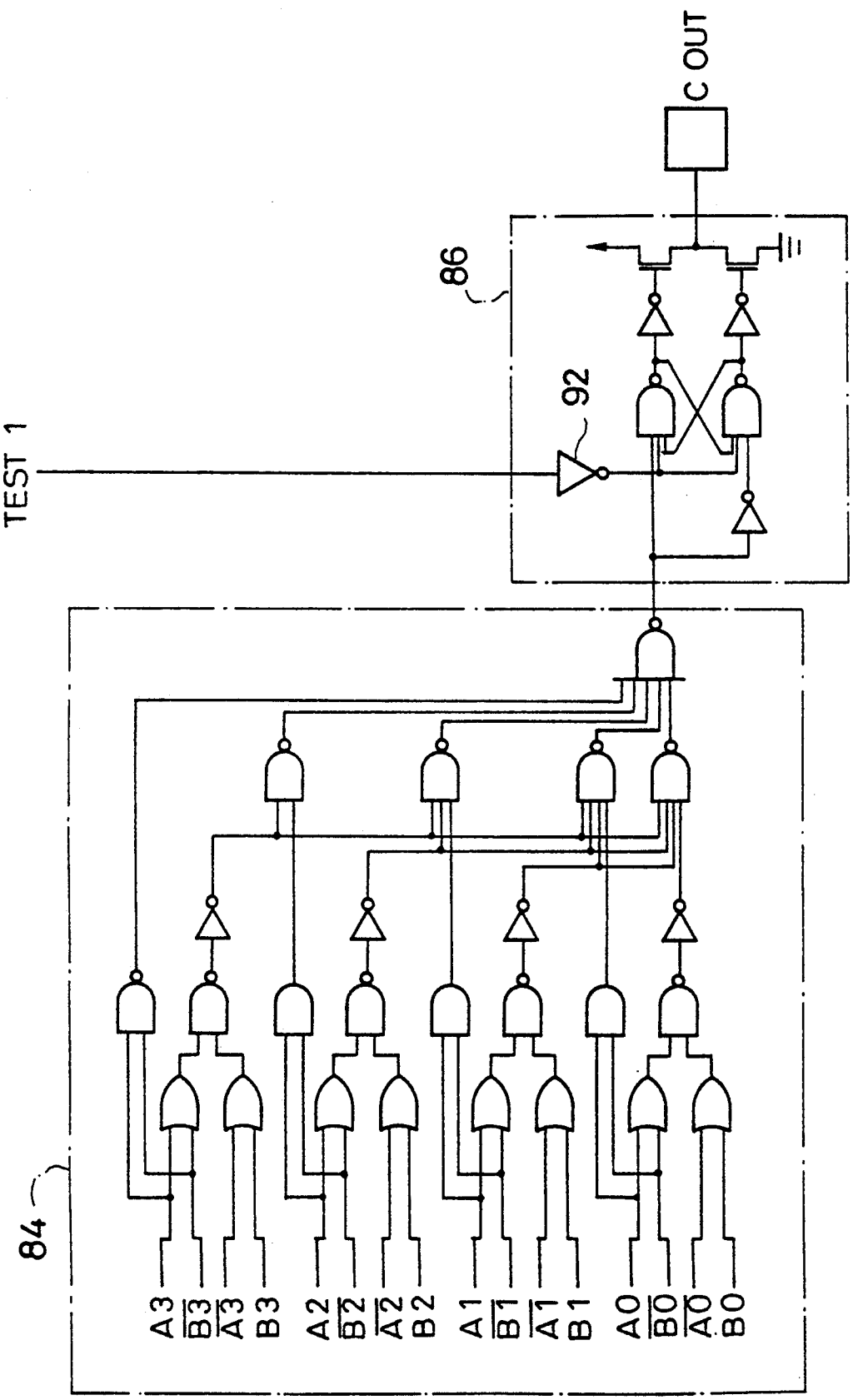
FIG. 12 is a schematic diagram of the comparator and output circuit in FIG. 10.

The comparator 84 is, for example, a magnitude comparator with a circuit configuration like that shown in FIG. 12, comprising a plurality of OR gates, AND gates, NAND gates, and inverters. This circuit receives the refresh address A0, A1, ..., An from the refresh address counter 76 and the pass value B0, B1, ..., Bn from the register 82 and produces an output signal that is high if the refresh address value is equal to or greater than the pass value. The drawing shows the n=3 case, but of course the invention is not restricted to any particular value of n.

FIG. 12 also shows an example of the configuration of the output circuit 86, basically a set-reset flip-flop circuit that receives the output from the comparator 84 and supplies the same logic value to the output terminal COUT. An additional inverter 92 receives the TEST1 signal from the test controller 80 and places the output COUT in the high-impedance state when the TEST1 signal is high.

Figure 13:
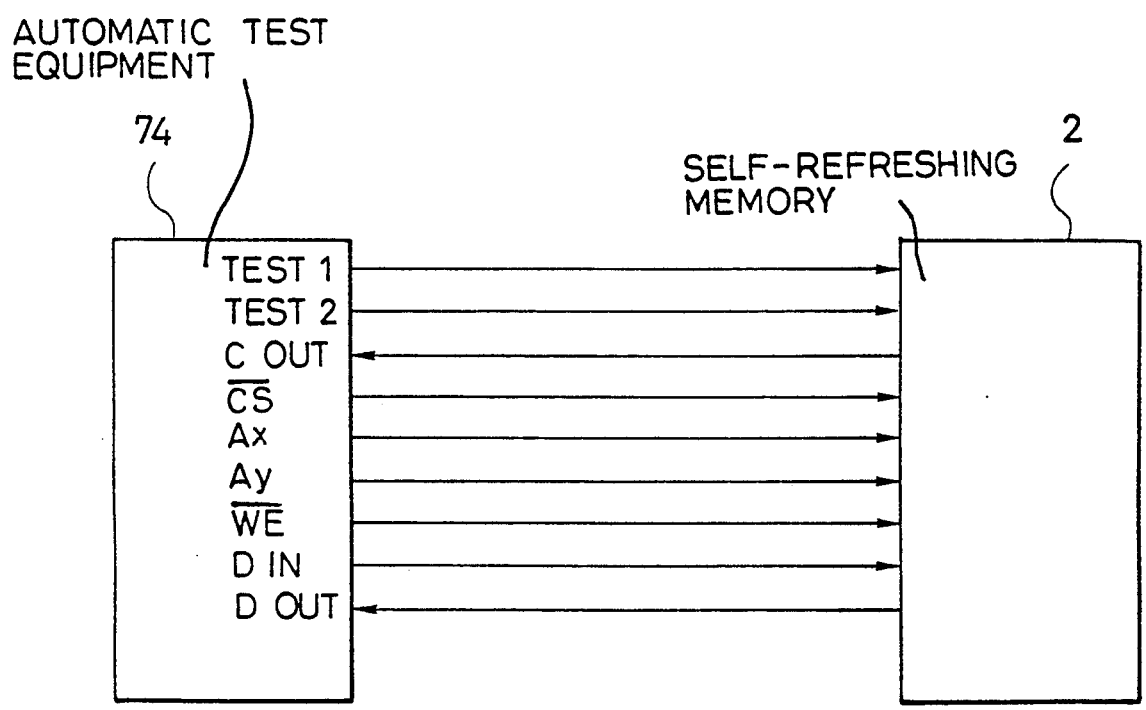
FIG. 13 is a diagram showing interconnections between automatic test equipment and the memory illustrated in FIGS. 1 and 10.

FIG. 13 shows how this self-refreshing memory is connected to automatic test equipment 74. The connections are the same as in FIG. 8 except that the automatic test equipment 74 needs to provide only two test signals, TEST1 and TEST2, for the refresh cycle test.

Figure 14:
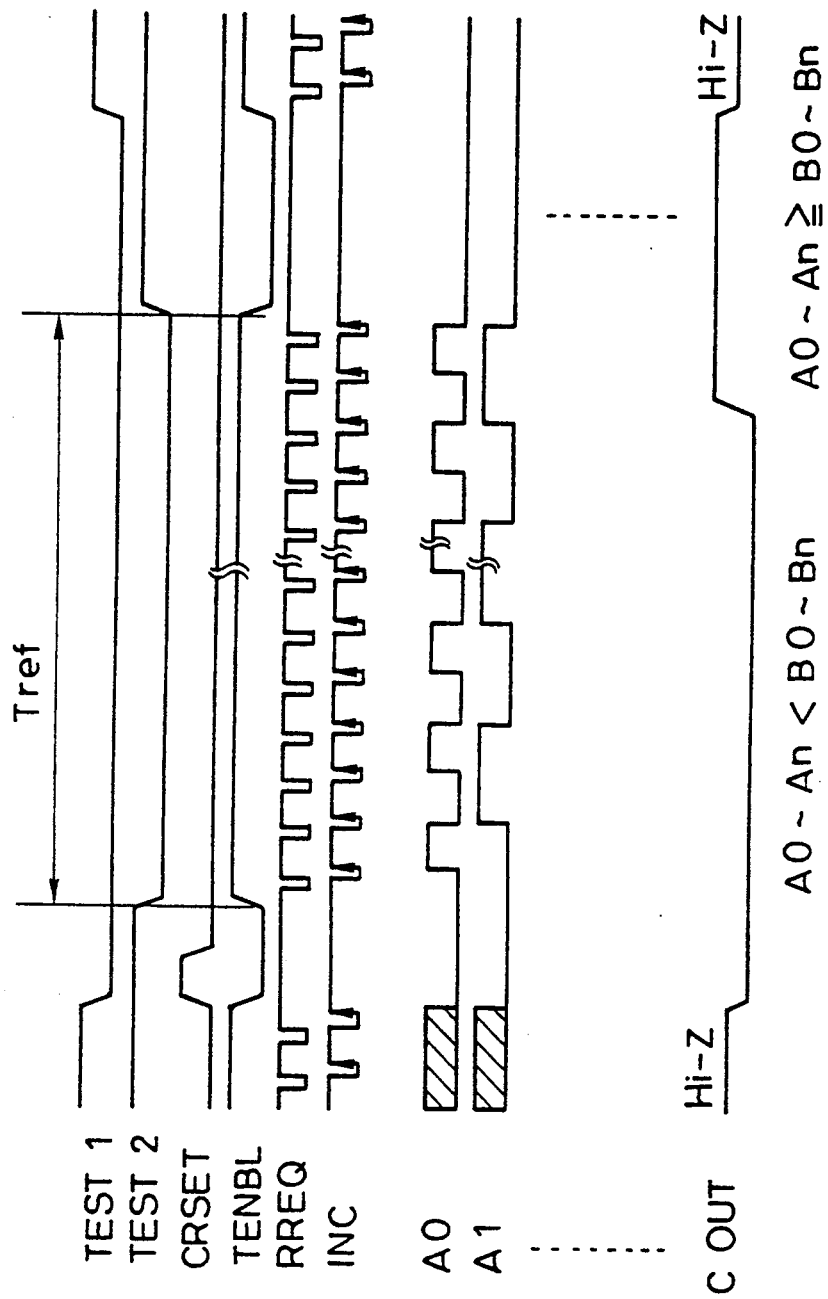
FIG. 14 is a timing diagram of a refresh cycle test.

FIG. 14 is a timing diagram of a refresh cycle test. In the initial state TEST1 and TEST2 are high, CRESET is low, TENBL, RREQ, and INC are high, and COUT is in the high-impedance state. As before, the automatic test equipment 74 begins the test by driving TEST1 low, producing a high CRESET pulse that resets the refresh address to zero and makes TENBL go low to disable output of refresh request signals. Then the automatic test equipment 74 drives TEST2 low for a precise interval Tref, during which refresh request pulses RREQ and increment pulses INC are output and counted.

During the interval Tref the output signal COUT remains low as long as the refresh address A0, ..., An is less than the pass value B0, ..., Bn, and goes high as soon as the refresh address equals or exceeds the pass value. At the end of the interval Tref the automatic test equipment 74 drives TEST2 high to disable output of refresh request pulses, and reads the value of COUT. If COUT is high, the memory passes the test since the number of refresh requests was greater than or equal to the pass value. If COUT is low, the memory fails the test since the number of refresh requests was less than the pass value.

If the refresh timer is programmable (for example, fuse-programmable using a scheme like the one shown in FIG. 11), then when the refresh cycle test fails, the refresh timer can be programmed to run faster and the refresh cycle test can be performed again. This procedure can be repeated until the test passes, enabling the manufacturer to raise yields and lower manufacturing costs.

It will be apparent to those skilled in the art that the novel refresh test circuits shown in the drawings can be modified in various further ways without departing from the spirit and scope of the invention. For example, the shift register in FIGS. 2 and 7 can be designed to output the actual refresh address value instead of its one's complement, and can shift this value toward the most significant bit instead of the least significant bit. Moreover, the test signals TEST1, TEST2, TEST3, and TEST4 were all active low, but the circuits can be designed so that these signals are active high.

What is claimed is:

1. A self-refreshing memory, suitable for testing by automatic test equipment, comprising:
    a plurality of dynamic memory cells for storing data at designated addresses;
    a refresh timer for receiving an enable signal having active and inactive states, and generating refresh request signals at fixed intervals while said enable signal is active;
    a refresh controller for receiving said refresh request signals, refreshing the data in said memory cells at addresses corresponding to a refresh address, and generating an increment signal;
    a refresh address counter for receiving and counting occurrences of said increment signal, thus generating said refresh address; and
    a refresh test circuit for receiving test signals from the automatic test equipment and, in response thereto, resetting said refresh address counter, generating said enable signal, and outputting said refresh address to said automatic test equipment, said refresh test circuit including:
    a shift register, for receiving and shifting said refresh address, thus generating serial data;
    an output circuit for receiving said serial data and outputting said serial data to the automatic test equipment; and
    a test controller for receiving said test signals from the automatic test equipment and, in response thereto, resetting said refresh address counter, generating said enable signal, loading said refresh address from said refresh address counter into said shift register, and shifting said serial data from said shift register to said output circuit.

2. The memory of claim 1, wherein said test controller receives from said automatic test equipment:
    a first test signal having an active state and an inactive state;

a second test signal having an active state and an inactive state;

a third test signal having an active state and an inactive state; and a fourth test signal having an active state and an inactive state.

3. The memory of claim 2, wherein said test controller resets said refresh address counter when said first test signal changes from said inactive state to said active state.

4. The memory of claim 2, wherein said test controller makes said enable signal active when said first test signal and said second test signal are in identical states, and makes said enable signal inactive when first test signal and said second test signal are in different states.

5. The memory of claim 2, wherein said test controller loads said refresh address from said refresh address counter into said shift register when said third test signal is active.

6. The memory of claim 2, wherein said test controller shifts said refresh address into said shift register when said fourth control signal changes from said inactive state to said active state.

7. The memory of claim 2, wherein said test controller comprises:

an inverting delay line for receiving an input signal responsive to said first test signal, and inverting and delaying said input signal to generate an output signal;

a first logic circuit for receiving both the input signal and the output signal of said inverting delay line, and performing a logic operation thereon to generate a signal for resetting said address counter; and a second logic circuit for receiving said first test signal and said second test signal, and performing a logic operation thereon to generate said enable signal.

8. The memory of claim 7, wherein said first logic circuit comprises a NAND gate.

9. The memory of claim 7, wherein said first logic circuit comprises a NOR gate.

10. The memory of claim 7, wherein said second logic circuit comprises an exclusive-NOR gate.

11. The memory of claim 7, wherein said test controller also comprises:

an inverter for inverting said third test signal to generate a signal for loading said shift register; and an inverter for inverting said fourth test signal to generate a signal for shifting said shift register.

12. A self-refreshing memory, suitable for testing by automatic test equipment, comprising:

a plurality of dynamic memory cells for storing data at designated addresses;

a refresh timer for receiving an enable signal having active and inactive states, and generating refresh request signals at fixed intervals while said enable signal is active;

a refresh controller for receiving said refresh request signals, refreshing said data in said memory cells at addresses corresponding to a refresh address, and generating an increment signal;

a refresh address counter for receiving and counting occurrences of said increment signal, thus generating said refresh address; and a refresh test circuit having a preset pass value, for receiving test signals from the automatic test equipment and, in response thereto, resetting said refresh address counter, generating said enable signal, comparing said refresh address with said pass value, and notifying the automatic test equipment whether said refresh address is at least equal to said pass value.

13. The memory of claim 12, wherein said refresh test circuit comprises:

a register for storing said pass value;

a comparator for comparing said refresh address with said pass value and generating a pass-fail signal;

an output circuit for outputting said pass-fail signal to the automatic test equipment; and a test controller for receiving said test signals from the automatic test equipment and, in response thereto, resetting said refresh address counter and generating said enable signal.

14. The memory of claim 13, wherein said register is fuse-programmable.

15. The memory of claim 13, wherein said test controller receives from said automatic test equipment:

a first test signal having an active state and an inactive state; and a second test signal having an active state and an inactive state.

16. The memory of claim 15, wherein said test controller resets said refresh address counter when said first signal changes from said inactive state to said active state.

17. The memory of claim 15, wherein said test controller makes said enable signal active when said first test signal and said second test signal are in identical states, and makes said enable signal inactive when first test signal and said second test signal are in different states.

18. The memory of claim 15, wherein said test controller comprises:

an inverting delay line for receiving an input signal responsive to said first test signal, and inverting and delaying said input signal to generate an output signal;

a first logic circuit for receiving both the input signal and the output signal of said inverting delay line, and performing a logic operation thereon to generate a signal for resetting said address counter; and a second logic circuit for receiving said first test signal and said second test signal, and performing a logic operation thereon to generate said enable signal.

19. The memory of claim 18, wherein said first logic circuit comprises a NAND gate.

20. The memory of claim 18, wherein said first logic circuit comprises a NOR gate.

21. The memory of claim 18, wherein said second logic circuit comprises an exclusive-NOR gate.

22. A method of testing a self-refreshing memory having a refresh timer, a refresh controller, and a refresh address counter, comprising the steps of:

(a) disabling said refresh timer;

(b) resetting said refresh counter;

(c) enabling said refresh timer for a certain interval;

(d) disabling said refresh timer again; and (e) generating an output signal responsive to contents of said refresh counter.

23. The method of claim 22, wherein said output signal is a serial data signal comprising the contents of said refresh counter.

24. The method of claim 22, wherein said output signal is a pass-fail signal indicating whether the contents of said refresh address counter is equal to or greater than a certain value.

25. The method of claim 22, comprising a further step of adjusting the refresh timer according to said output signal.

* * * * *